United States Patent
Wyman et al.

(10) Patent No.: US 6,774,715 B2
(45) Date of Patent: Aug. 10, 2004

(54) BICMOS AC FILTER CIRCUIT

(75) Inventors: Ted Wyman, Mont Vernon, NH (US);
Fouad Kiamilev, Hockessin, DE (US)

(73) Assignee: Xanoptix Inc., Merrimack, NH (US)

( * ) Notice: Subject to any disclaimer, the term of this patent is extended or adjusted under 35 U.S.C. 154(b) by 0 days.

(21) Appl. No.: 10/180,369

(22) Filed: Jun. 26, 2002

(65) Prior Publication Data

US 2003/0075986 A1 Apr. 24, 2003

Related U.S. Application Data

(60) Provisional application No. 60/302,204, filed on Jun. 29, 2001.

(51) Int. Cl.[7] .................. H03F 1/02; H03F 21/00; H03F 3/45; H03L 5/00
(52) U.S. Cl. .................. 330/9; 330/11; 330/257; 327/307
(58) Field of Search ............... 330/9, 11, 252, 330/253, 257, 300; 327/307

(56) References Cited

U.S. PATENT DOCUMENTS

| | | | | |
|---|---|---|---|---|
| 4,990,803 A | * | 2/1991 | Gilbert ................ | 327/351 |
| 5,610,547 A | * | 3/1997 | Koyama et al. ........ | 327/350 |
| 5,886,581 A | * | 3/1999 | Hugel et al. .......... | 330/308 |
| 5,994,927 A | * | 11/1999 | Naito et al. ........... | 327/72 |
| 6,016,067 A | * | 1/2000 | Vulih et al. ........... | 327/94 |
| 6,037,832 A | | 3/2000 | Kaminishi | |
| 6,160,450 A | * | 12/2000 | Eschauzier et al. ..... | 330/253 |

OTHER PUBLICATIONS

Dines, J., "Smart Pixel Optoelectronic Receiver Based on a Charge Sensitive Amplifier Design", IEEE Journal of Selected Topics in Quantum Electronics, vol. 2 No. 1, pp. 117–120, Apr. 1996.
Madhavan B. and Levi A.F.J., "Low–power 2.5Gbit/s VCSEL driver in 0.5 $\mu$m CMOS technology", Electronics Letters, vol. 34, No. 2, pp. 178–179, Jan. 22, 1998.
Van Blerkom, D., "Transimpendance Receiver Design Optimization for Smart Pixel Arrays", *Journal of Lightwave Technology*, vol. 16, No. 1, pp. 119–126, Jan. 1998.
Woodward, T. et al., "Optical Receivers for Optoelectronic VLSI", IEEE Journal Of Selected Topics In Quantum Electronics, vol. 2, No. 1, pp. 106–115, Apr. 1996.
Woodward, T.K., "Optical Receivers for Smart Pixel Applications", Photonics West Conference, Jan. 1996, pp. 67 and 68.
Woodward, T.K. et al., "Parallel operation of 50 element two–dimensional CMOS smart–pixel receiver array", IEEE, 1998.
International Search Report dated Apr. 10, 2003.

* cited by examiner

*Primary Examiner*—Patricia Nguyen
(74) *Attorney, Agent, or Firm*—Morgan & Finnegan LLP

(57) ABSTRACT

An alternating current filter circuit for a BiCMOS differential amplifier has a circuit that computes a base current of the BiCMOS differential amplifier and a circuit that generates an offset current based upon the computing.

9 Claims, 4 Drawing Sheets

BICMOS AC FILTER CIRCUIT

CROSS REFERENCE TO RELATED APPLICATIONS

This application claims priority under 35 USC 119(e)(1) of U.S. Provisional Patent Application Serial No. 60/302,204, filed Jun. 29, 2001.

FIELD OF THE INVENTION

This invention relates to filter circuits and, more particularly, to alternating current filter circuits.

BACKGROUND

An alternating current (AC) filter circuit is an important component of many integrated circuits among them high-speed optical communications receivers. Conventional implementations of AC filter circuits for complementary metal oxide semiconductor (CMOS) type differential amplifiers typically rely on a simple resistor-capacitor filter fed to a differential amplifier, such as shown in FIG. 1.

In the circuit of FIG. 1, the parallel-connected resistor (R1) and capacitor (C1) in combination act as a low-pass filter to produce an average value of the input signal to the gate electrode of the metal oxide semiconductor MOS transistor (M1). This average value is used as the threshold level for decoding the input signal into a stream of 1s and 0s. To achieve the threshold function, the filtered average value 12 from low-pass filter 10 is fed to the gate electrode of first MOS transistor (M1) of differential amplifier 20, and the original non-filtered signal 14 is fed to the gate electrode of second MOS transistor (M2) of differential amplifier 20. The two input values (i.e., signals 12, 14) are compared at the differential amplifier 20. If the signal at M2 (i.e., signal 14) is greater than the signal at M1 (i.e., signal 12), then the output from differential amplifier 20 would be a '1' otherwise it is a '0'. The output of the differential amplifier may be further amplified for a processing of the input signal.

CMOS type transistors offer the advantages of being relatively inexpensive to process, having low power dissipation, and they can be tightly packed and scaled. Bipolar junction transistors, on the other hand, are a preferred choice for analog applications because of their ability to provide high speed, high drive current, and a good noise margin. Additionally, bipolar junction transistors provide smaller threshold voltage variations and are therefore often used as voltage references.

What is needed is a way to create high-speed circuits having the speed of BiCMOS differential amplifier circuitry but does not have a time fluctuating base current into the amplifier input which may cause decoding errors in the BiCMOS amplifier because it is sensitive to fluctuating inputs.

SUMMARY OF THE INVENTION

An AC filter circuitry for a differential amplifier is disclosed in which the AC filter automatically compensates for the voltage drops caused by the fluctuating base current from the a differential amplifier built with BiCMOS technology.

An exemplary alternating current filter circuit of the present invention for a BiCMOS differential amplifier has a circuit that computes a base current of the BiCMOS differential amplifier, and a circuit that generates an offset current based upon the computing.

In another aspect of the invention, the required current to offset the resistive voltage drops caused by the base current of the differential amplifier is calculated by the computing circuit and the offset current is then generated by the generating circuit. Subsequently, the generated offset current is fed into buffering circuitry which in turn is input to the differential amplifier.

Other and further aspects of the present invention will become apparent during the course of the following detailed description and by reference to the attached drawings.

The advantages and features described herein are a few of the many advantages and features available from representative embodiments and are presented only to assist in understanding the invention. It should be understood that they are not to be considered limitations on the invention as defined by the claims, or limitations on equivalents to the claims. For instance, some of these advantages are mutually contradictory, in that they cannot be simultaneously present in a single embodiment. Similarly, some advantages are applicable to one aspect of the invention, and inapplicable to others. Thus, this summary of features and advantages should not be considered dispositive in determining equivalence. Additional features and advantages of the invention will become apparent in the following description, from the drawings, and from the claims.

DETAILED DESCRIPTION

Figure 1:
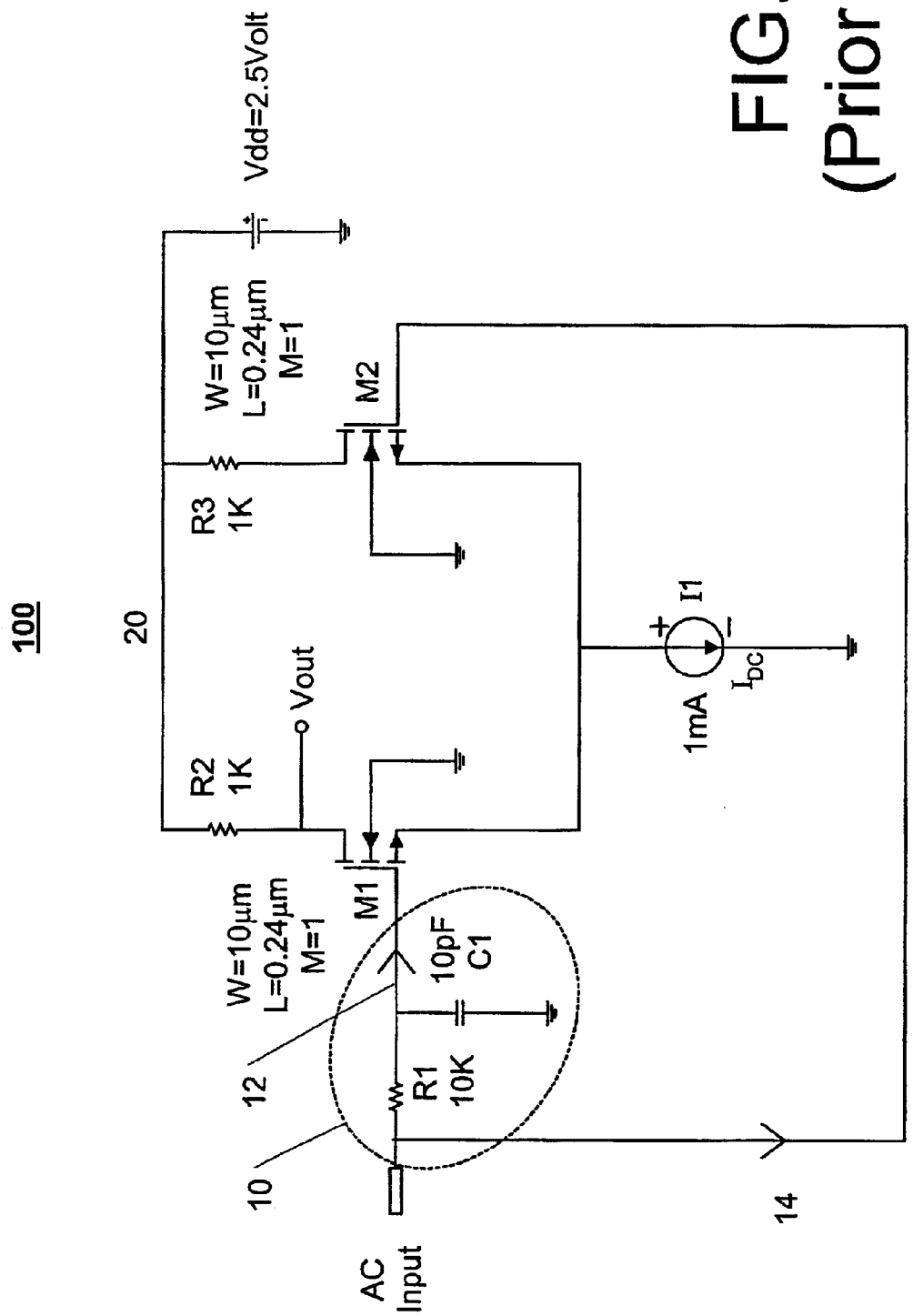
FIG. 1 shows a conventional CMOS implementation of an AC filter circuit.
Figure 2:
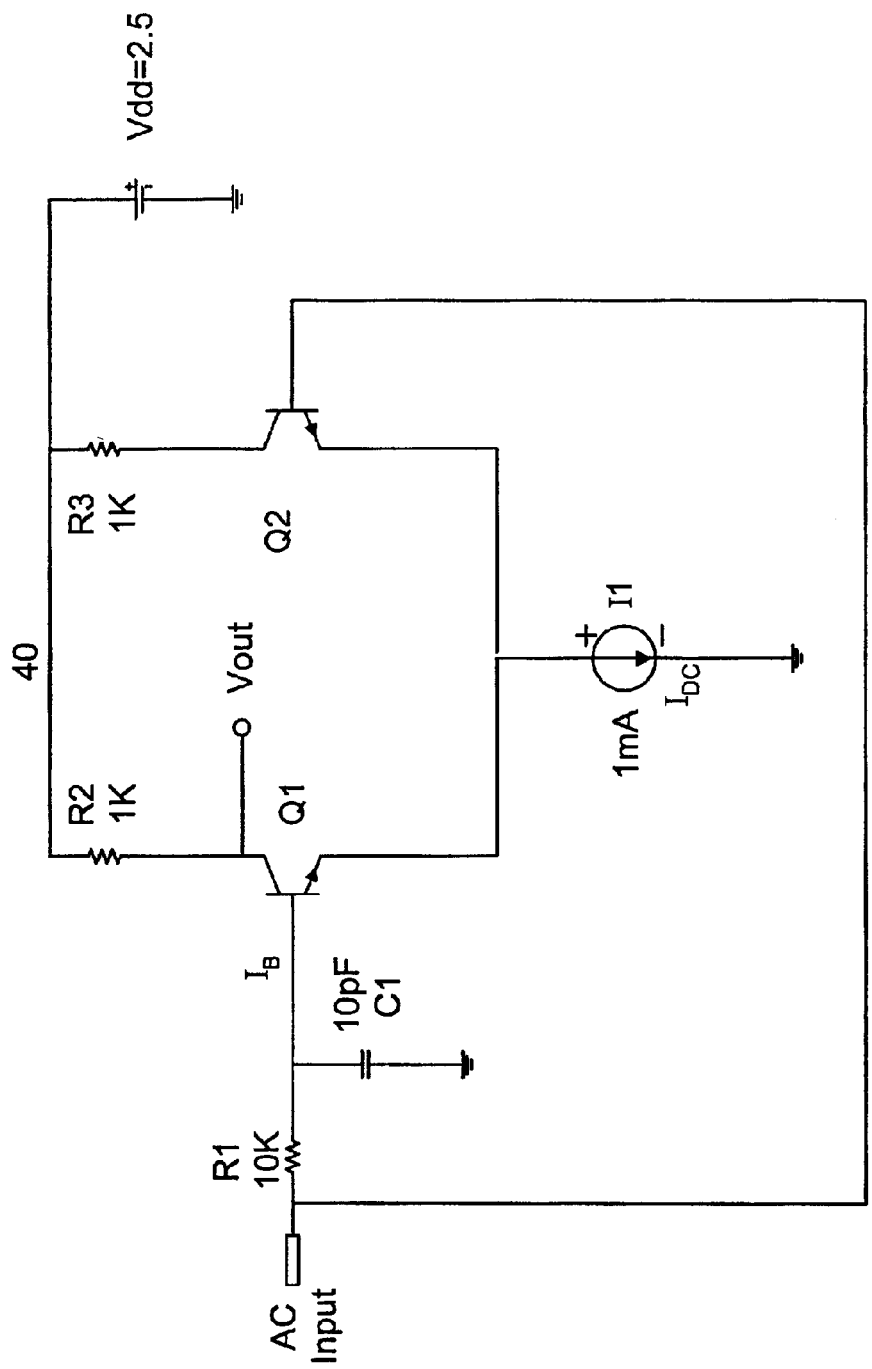
FIG. 2 shows an implementation of an AC filter in BiCMOS technology.

Implementation of an AC filter in BiCMOS technology, for example, as shown in FIG. 2, poses particular challenges. Specifically, bipolar transistors have a small and time-varying base current ($I_B$) portion that introduces errors in the average voltage input to the transistor because this current would flow through in reverse direction to the resistor R1 and thus creates a voltage drop of $R1 \times I_B$. Hence, the average voltage value sensed at the first bipolar junction transistor Q1 would not be the true average voltage from the receiver, but somewhat lower (and lower by a varying amount of $R1 \times I_B$). This can introduce increased and time-dependent data errors in decoding of signals (i.e. errors in decoding '1s' from '0s').

Moreover, converting a CMOS implementation of an AC filter into BiCMOS is not always possible because the required high-speed of operation can only be achieved using the bipolar transistor devices.

Figure 3:
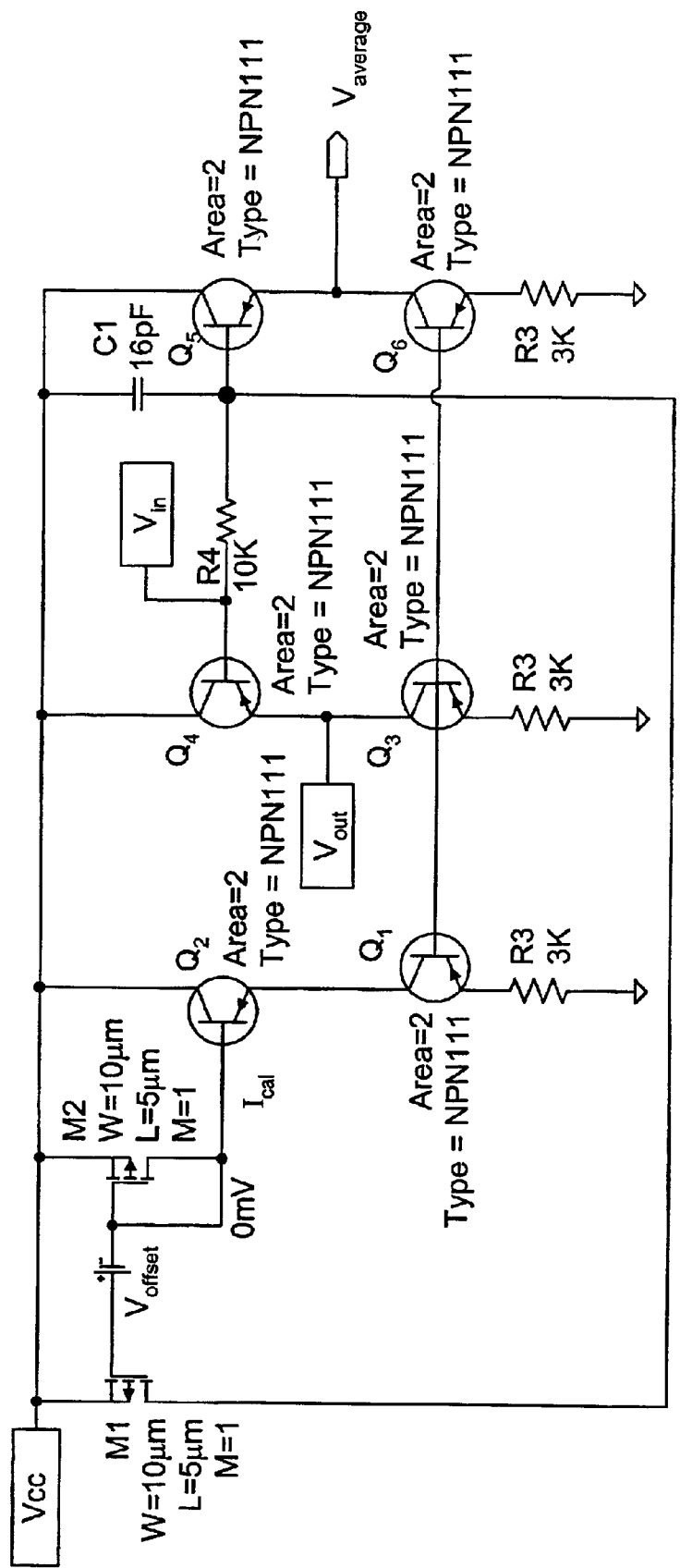
FIG. 3 is one example implementation of a circuit that provides a solution to the problems of the prior art in accordance with the teachings of the invention.

FIG. 3 is an exemplary embodiment of a high-speed AC filter circuitry of the present invention that operates at the speed compatible with BiCMOS circuitry of the differential amplifier but does not have a time fluctuating base current into the differential amplifier.

Bipolar buffer amplifier (Q3 and Q4) shown in the signal path produces a voltage shift in the signal path. Bipolar buffer amplifier (Q5 and Q6) is added to the output of the simple RC filter (resistor R4 and capacitor C1). Bipolar transistors Q1 and Q2 comprise a computing circuit that computes the current required to compensate for the base current of the buffer amplifier Q5 and Q6. The calculated current $I_{cal}$ is fed into the mirror circuit comprised of PMOS transistors M1 and M2. The mirror circuit outputs a current that is approximately identical to the input current (i.e., $I_{cal}$). Subsequently, the output current from the mirror circuit is fed into the base terminal of the emitter-follower circuit (i.e., buffer amplifier circuit) comprised of bipolar transistors Q5 and Q6 which precedes the differential amplifier. The emitter follower (i.e., a buffer amplifier circuit Q5 and Q6) is added to create a DC bias replication scheme. The output voltage from the emitter follower circuit is a stabilized input to the differential amplifier.

Briefly, the required current to offset the resistive voltage drops caused by the base current of the buffer amplifier Q5 and Q6 is calculated by the computing circuit and the offset current is then fed into the emitter-follower circuitry which in turn is input to the differential amplifier. As a result, the AC filter circuitry of the present invention automatically compensates for the voltage drops caused by the base current from the buffer amplifier.

Figure 4:
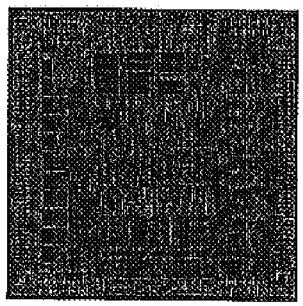
FIG. 4 shows a chip designed and built in accordance with the invention.
Figure 5:
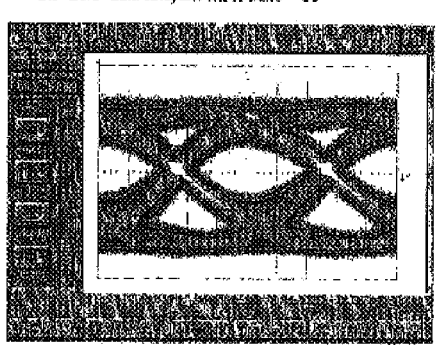
FIG. 5 is an eye diagram for the chip of FIG. 4.

FIG. 4 is a photograph of chip we have designed containing both lasers a number of circuits (36 of them) in accordance with the invention. They have been tested in conjunction with post-detection amplifiers to boost signals to standard digital levels. FIG. 5 is an eye diagram for the chip of FIG. 4 showing measurements of the variations or distortions in the optical signals. These circuits have been tested up to 2.5 Gb/s and have shown bit error rates (when using them to drive optical signals over more than 1 kilometer) of better than $10^{-15}$. We have further ascertained that the errors induced at this level are from laser noise issues and not due to fluctuations of the electronic base current.

As a result, we have achieved the benefits and advantages attendant with a lower bit error rate in high speed circuits while eliminating a current fluctuation (which translates to noise in the system).

It should be understood that the above description is only representative of illustrative embodiments. For the convenience of the reader, the above description has focused on a representative sample of all possible embodiments, a sample that teaches the principles of the invention. The description has not attempted to exhaustively enumerate all possible variations. That alternate embodiments may not have been presented for a specific portion of the invention, or that further undescribed alternate embodiments may be available for a portion, is not to be considered a disclaimer of those alternate embodiments. One of ordinary skill will appreciate that many of those undescribed embodiments incorporate the same principles of the invention and others are equivalent.

We claim:

1. An alternating current filter circuit for a BiCMOS differential amplifier comprising:

a buffer amplifier circuit having an output driving a bipolar differential amplifier;

a base current circuit that computes a base current of the buffer amplifier circuit; and an offset current circuit that generates an offset current based upon the computed base current, the offset current driving the buffer amplifier.

2. The alternating current filter circuit of claim 1, wherein the buffer amplifier circuit precedes the BiCMOS differential amplifier and inputs the offset current to the BiCMOS differential amplifier to thereby compensate for fluctuations in the input to the BiCMOS differential amplifier.

3. The alternating current filter of claim 1, wherein the buffer amplifier circuit is an emitter-follower circuit.

4. The alternating current filter of claim 3, wherein the buffer amplifier circuit comprises at least two bipolar junction transistors.

5. The alternating current filter of claim 1, wherein the base current circuit comprises at least two bipolar junction transistors.

6. The alternating current filter of claim 1, wherein the offset current circuit comprises a current mirror circuit.

7. The alternating current filter of claim 6, wherein the current mirror circuit comprises at least two MOS transistors.

8. The alternating current filter of claim 6, wherein the current mirror circuit comprises at least two bipolar junction transistors.

9. An alternating current filter circuit for a BiCMOS differential amplifier comprising:

a first buffer amplifier circuit being driven by an input signal to be processed and having an output that drives a first input to the bipolar differential amplifier;

a second buffer amplifier circuit being driven by an offset current and having an output that drives a second input to the bipolar differential amplifier, the offset current being generated by, a base current circuit that computes a base current of the second buffer amplifier circuit; and an current mirror circuit that generates the offset current from the computed base current.

* * * * *